(12) United States Patent
Chen et al.

(10) Patent No.: US 8,021,177 B2
(45) Date of Patent: Sep. 20, 2011

(54) BURN-IN SOCKET

(75) Inventors: Ming-Yue Chen, Tu-Cheng (TW); Zhen-Qi Yang, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/795,673

(22) Filed: Jun. 8, 2010

(65) Prior Publication Data

US 2010/0311264 A1    Dec. 9, 2010

(51) Int. Cl.
 *H01R 13/15* (2006.01)
(52) U.S. Cl. ....................................................... 439/264
(58) Field of Classification Search .................. 439/263, 439/264, 265, 254
 See application file for complete search history.

(56) References Cited

U.S. PATENT DOCUMENTS

| | | | |
|---|---|---|---|
| 6,655,974 B2 * | 12/2003 | Nakano et al. ................ | 439/259 |
| 7,121,858 B2 * | 10/2006 | Chen .............................. | 439/259 |
| 7,658,620 B2 * | 2/2010 | Hsiao et al. ..................... | 439/71 |
| 7,682,175 B2 * | 3/2010 | Gao et al. ....................... | 439/268 |
| 7,753,704 B2 * | 7/2010 | Chen .............................. | 439/268 |
| 2010/0003838 A1 * | 1/2010 | Cai et al. ......................... | 439/73 |

FOREIGN PATENT DOCUMENTS

TW    M331779    5/2008

* cited by examiner

*Primary Examiner* — Phuong Dinh
(74) *Attorney, Agent, or Firm* — Andrew C. Cheng; Wei Te Chung; Ming Chieh Chang

(57) ABSTRACT

A burn-in socket includes a base, a sliding plate mounted to the base, a number of contacts, and an actuator mounted on the base. The contact each has a base portion secured to the base and a pair of arms extending through the pin holes of the sliding plate. The actuator includes a frame and a number of actuating portion extending downwardly from the frame for driving the sliding plate to slide on the base in a first direction. The actuator includes a number of pushing portions contacting with the sliding plate and driving the sliding plate to move in a second direction opposite to said first direction.

9 Claims, 6 Drawing Sheets

BURN-IN SOCKET

BACKGROUND OF THE INVENTION

1. Field of the Invention

The present invention relates to a burn-in socket, and more particularly to a burn-in socket mounted on a printed circuit board (PCB) for testing an IC package.

2. Description of Prior Art

Central Processing Unit (CPU) and other electrical package, generally referred to as IC package, are undergone a test simulating its real working environment so as to make sure its functions from all intended ranges.

A conventional burn-in socket typically comprises a base, a plurality of contacts disposed on the base, latches, a sliding plate for driving the contacts, and an actuator for actuating the latches and the sliding plate. The contact each has a pair of arms inserted into the sliding plate and one is stationary, the other is moveable. When pressing the actuator and driving the sliding plate to move in a transversal direction and further make the moving arm away from the stationary arm to create a space therebetween, solder balls of the IC package can be disposed in between the pair of arms. When the actuator is released, the moving arm will close toward the stationary arm and sandwich the solder ball therebetween. A spring is provided between the base and the sliding plate for driving the sliding plate and the moving arms back to the original positions. However, the solder balls of the IC package exert a downward force to the sliding plate which further products a friction between the base and the sliding plate. If the friction is larger than the elastic force of the spring, the sliding plate will not come back to the true positions and affect the reliability of the contacts.

Thus, there is a need to provide an improved burn-in socket to overcome the above-mentioned problems.

SUMMARY OF THE INVENTION

An object of the present invention is to provide a burn-in socket for accurately positioning sliding plate during testing.

In order to achieve the object set forth, a burn-in socket comprises a base, a sliding plate mounted to the base and having a plurality of pin holes, a plurality of contacts, and an actuator mounted on the base. The contact each comprises a base portion secured to the base and a pair of arms extending through the pin holes of the sliding plate. The actuator includes a frame and a plurality of actuating portion extending downwardly from the frame for driving the sliding plate to slide on the base in a first direction. The actuator includes a pushing portion contacting with the sliding plate and driving the sliding plate to move in a second direction opposite to said first direction.

BRIEF DESCRIPTION OF THE DRAWINGS

Other objects, advantages and novel features of the present invention will become more apparent from the following detailed description when taken in conjunction with the accompanying drawings, in which.

DESCRIPTION OF PREFERRED EMBODIMENT

Figure 1:
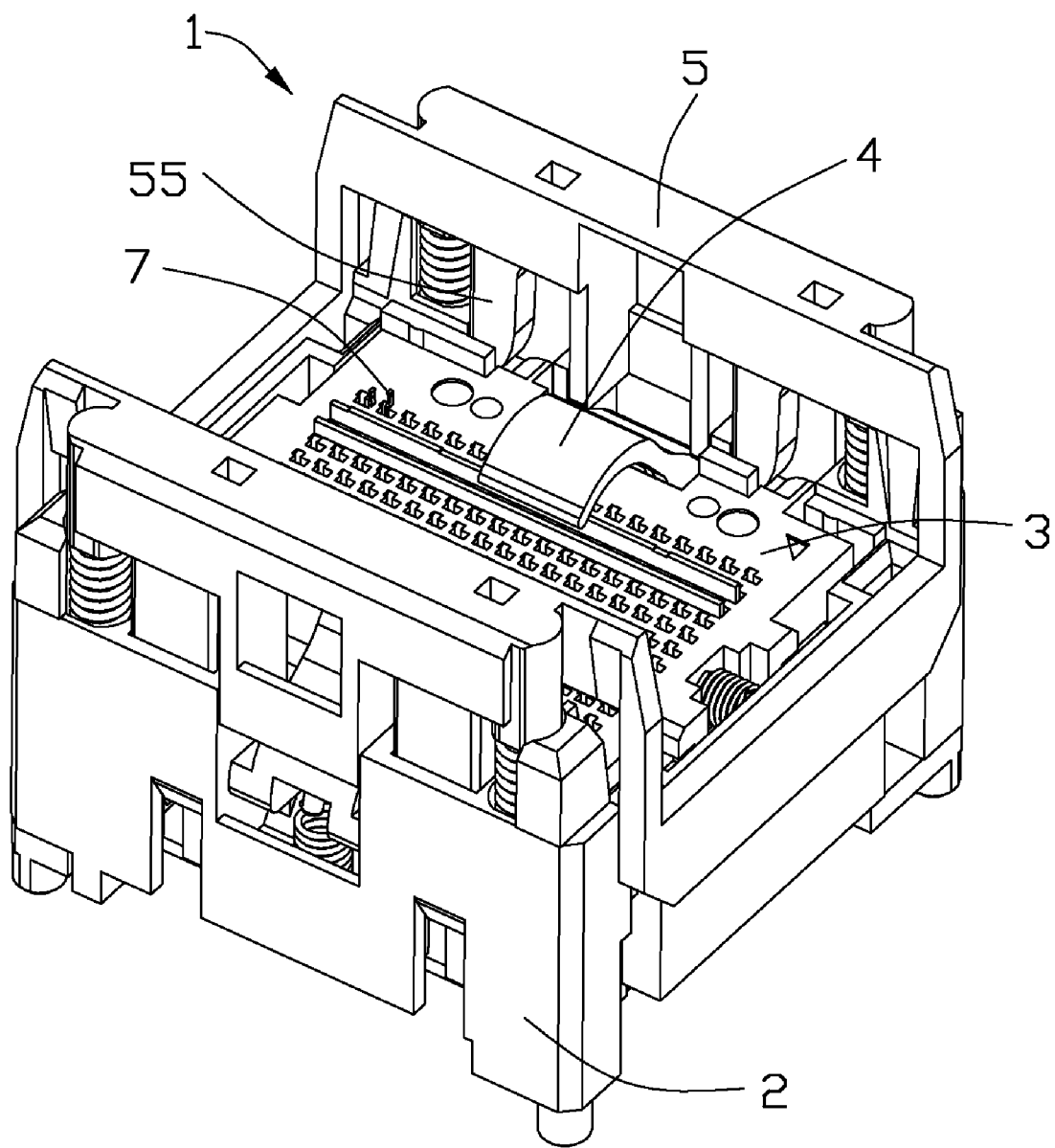
FIG. 1 is an assembled, perspective view of a burn-in socket in accordance with a preferred embodiment of the present invention.
Figure 2:
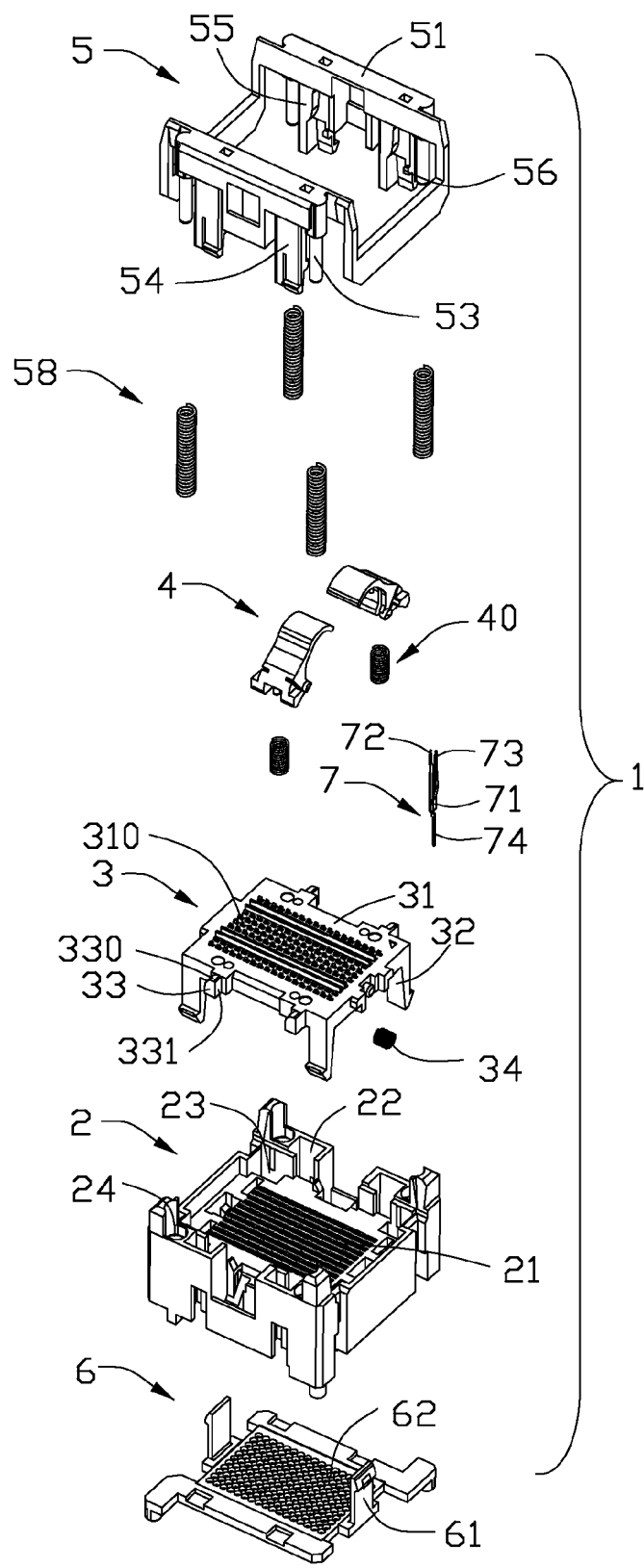
FIG. 2 is an exploded, perspective view of the burn-in socket shown in FIG. 1.
Figure 5:
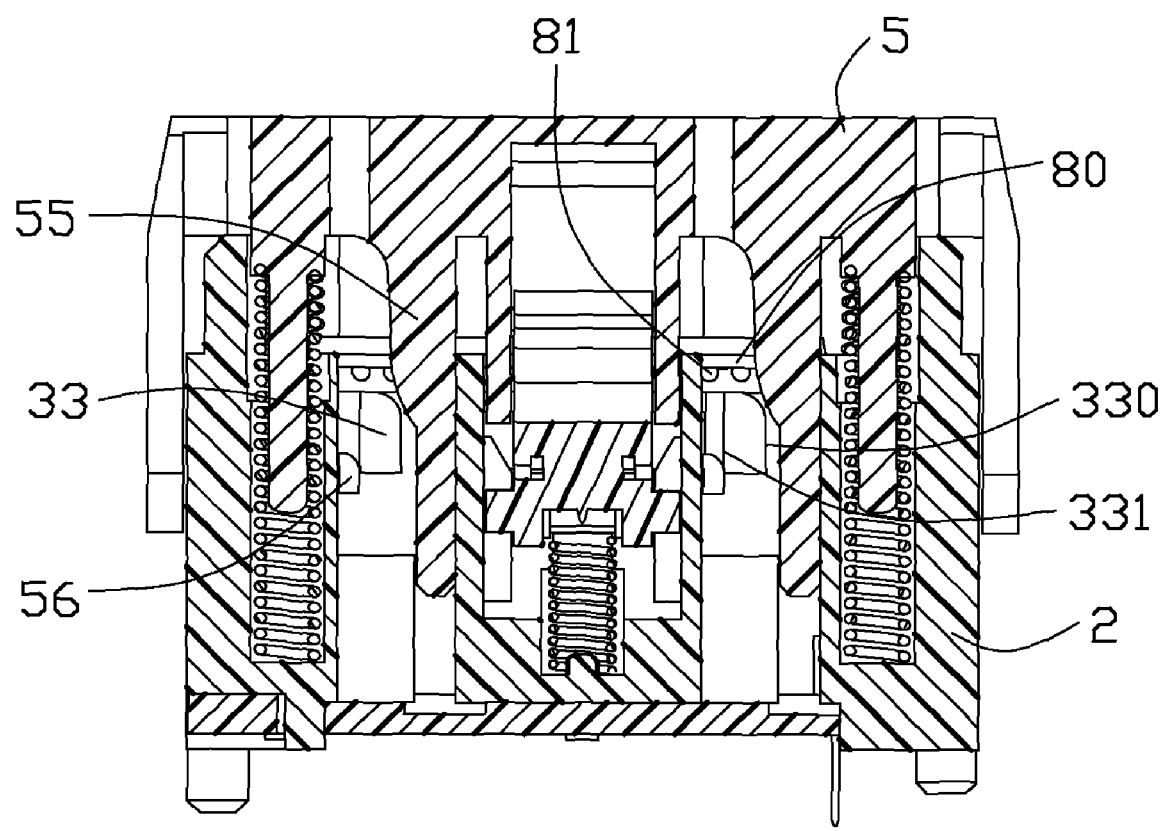
FIG. 5 is similar to FIG. 4 showing the actuator moves upwardly and the sliding plate are move to a left direction under the driving of the spring.

Referring to FIGS. 1-2, a burn-in socket 1 in accordance with a preferred embodiment of the present invention is generally mounted to a printed circuit board (not shown) to receive and test an IC package 80 (as shown in FIG. 5). The burn-in socket 1 includes a base 2, a plurality of contacts 7 mounted to the base 2, a sliding plate 3 sliding on the base 2, an actuator 5 movably mounted upon the base 2 for driving the sliding plate 3, and a pair of locking elements 4 for locking the IC package 80 loaded on the sliding plate 3. Besides, a plurality of springs 58 are provided between the actuator 5 and the base 2 so as to reset the actuator 5 after its downward movement. The pair of locking elements 4 is actuated by a pair of springs 40.

Referring to FIG. 2, the contact 7 includes a middle base portion 71, a pair of testing arms respectively extending upwardly from the base portion 71 and a tail portion 74 extending downwardly from the base portion 71. The pair of testing arms includes a stationary ram 73 with a linear configuration and a moving arm 72 movable relative to the stationary arm 73. Top ends of the testing arms are respectively formed with tip portions so as to jointly clip one solder ball 81 (shown in FIG. 5) of the IC package 80.

Figure 3:
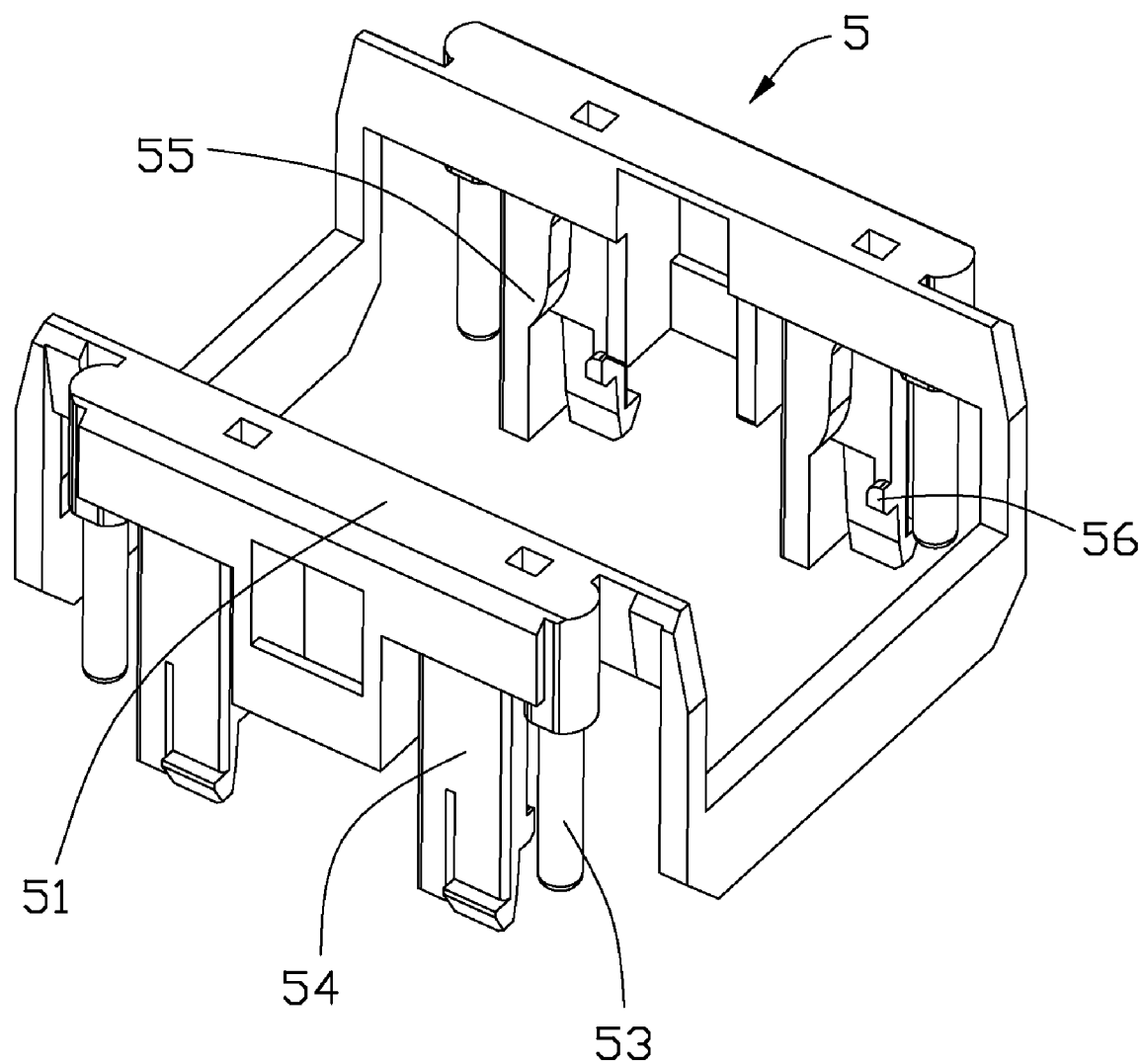
FIG. 3 is a perspective view of an actuator of the burn-in socket shown in FIG. 1.

Particularly referring to FIGS. 1-3, the base 2 includes a plurality of through holes 24 for receiving the springs 58, a plurality of first holes 22 for engaging with the actuator 5, and a plurality of second holes 23 for engaging with the sliding plate 3 at corners thereof. A bottom plate 6 is attached to the base 2 by a pair of latches 61. The bottom plate 6, the base 2, and the sliding plate 3 respectively define a plurality of pin holes 62, 21, 310 extending therethrough for the contacts 7 passing through. The base portion 71 is retained in the pin holes 21 of the base 2, and the tip portions extend out of the pin holes 310 of the sliding plate 3, while the tail portion 74 extends downwardly and out of the pin hole 62 of the bottom plate 6.

The sliding plate 3 slides transversally by the actuation of the actuator 5 and has main plate 31 and a plurality of bearing sections 33 which forms a curved guiding surface 330 and a vertical surface 331 opposite to the guiding surface 330. The sliding plate 3 is equipped with a spring 34 with one end thereof abutting against the sliding plate 3 and the other end abutting against the base 2 thereby driving the sliding plate 3 back to its original position after the transversal movement thereof. A plurality of latches 32 project downwardly from the main plate 31 and are received in the second holes 23 for securing the sliding plate 3 on the base 2.

The actuator 5 has a main frame 51, two pair of latches 54 engaging with the first holes 22 for positioning the actuator 5 on the base 2, four posts 53 extending downwardly from the frame 32 and projecting into the through holes 24, a plurality of actuating portions 55, and a plurality of pushing portions 56 extending downwardly from the frame 51. Each pushing portion 56 and a corresponding actuating portion 55 both engage with a same bearing section 33 on the sliding plate 3. The actuating portion 55 and the pushing portion 56 engage with opposite side surfaces 330, 331 of the same bearing section 33, respectively. The actuating portion 55 and corresponding pushing portion 56 are located at opposite sides of the bearing section 33 after attached to the base 2.

The moving and stationary arms 72, 73 are spaced from each other and the two locking elements 4 turn to an opened state when the actuator 5 is in a lower position. In this situation, the IC package 80 is easy to be easily placed into the base 2 or to be taken out of the base 2. When the actuator 5 returns to an original position, the moving and stationary arms 72, 73 move close to each other and jointly and clip the solder ball 81 of the IC package 80. The locking elements 4 are pressed on the IC package 80. It's a known technology concerning to the configuration of the sliding plate 2 and the principles about how to actuate the contacts 7, and will not be specifically described herein.

Figure 4:
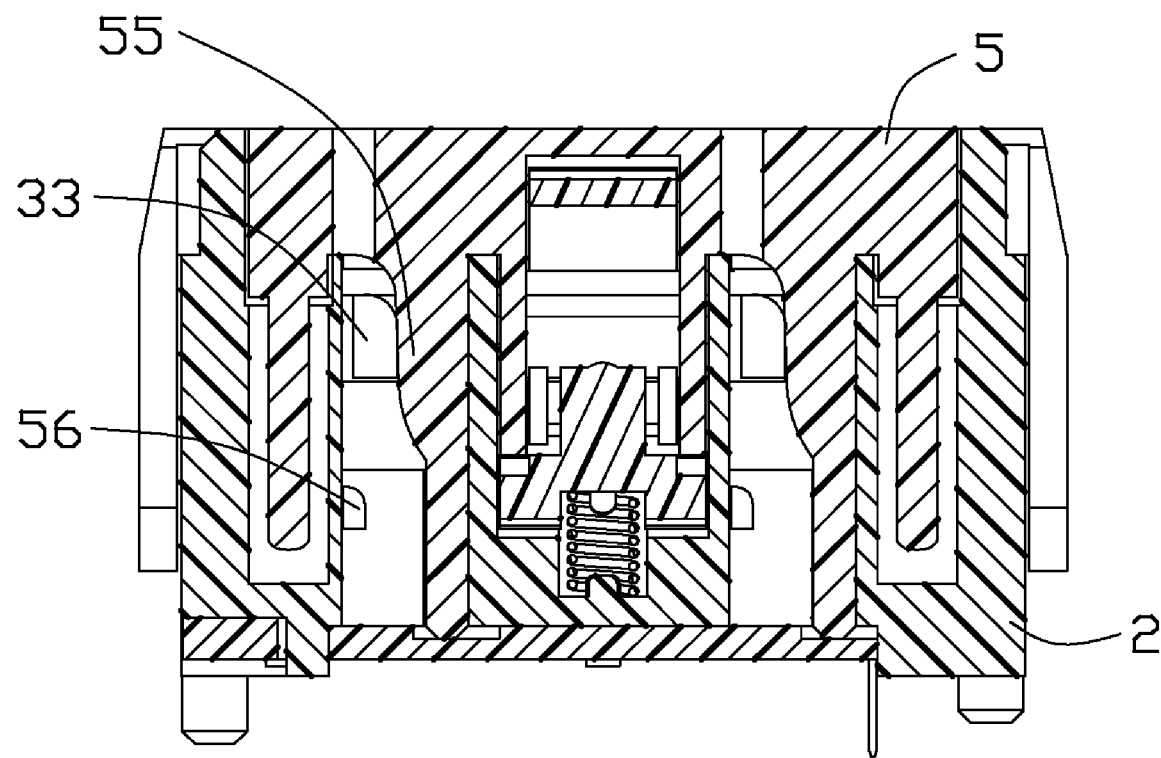
FIG. 4 is a sketch view showing the actuator is located at a lower position and the actuating portions drive the sliding plate moving to a right direction.
Figure 6:
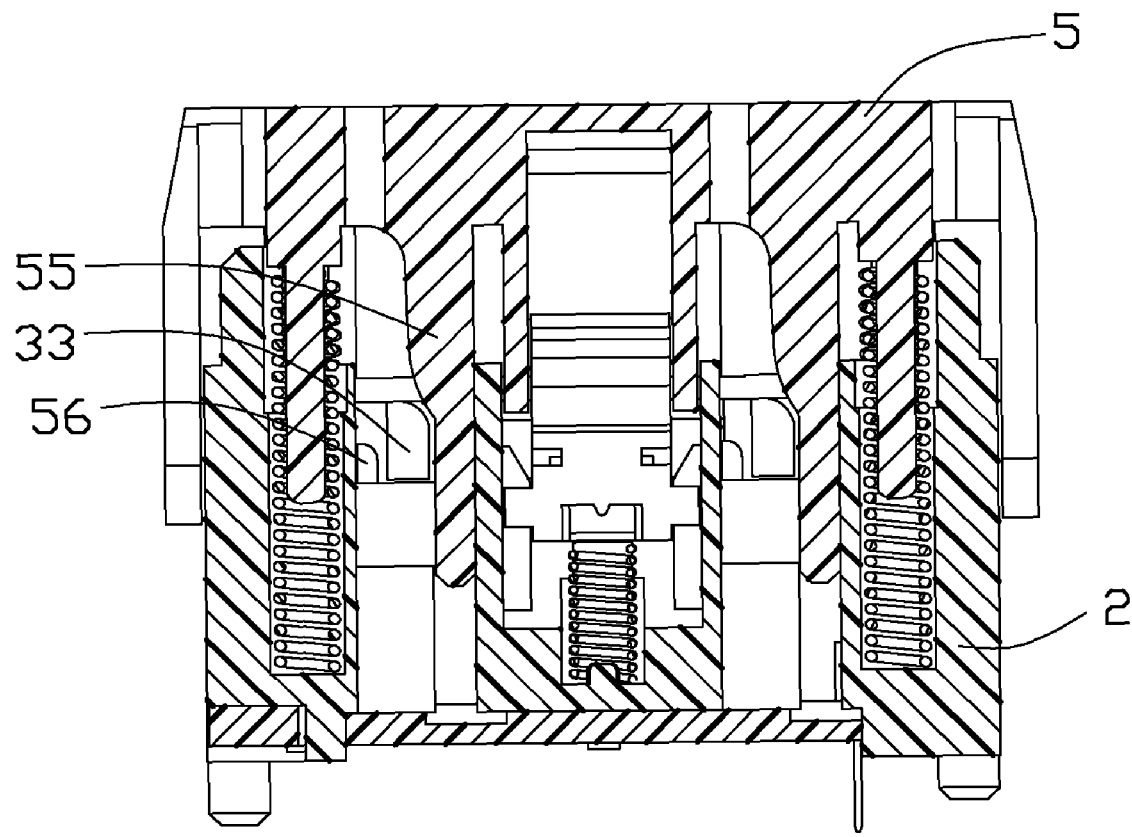
FIG. 6 is similar to FIG. 4 showing the actuator is located at an upper position and the pushing portions driving the sliding plates further to move to the left direction.

After assembly, push down the actuator 5, the locking elements 4 are opened and the IC package 80 is put on the sliding plate 3. When the actuator 5 moves downwardly, the actuating portions 55 contact with the bearing sections 33 and drive the sliding plate 3 move to left as shown in FIG. 4 until the actuator 5 reaches the lowest position. Then, the actuator 5 is released and moves upwardly, the sliding plate 3 moves back to right since the spring 34 producing a force thereon as shown in FIG. 5. With upward movement of the actuator 5, the pushing portions 56 contact with the bearing sections 33 and further drive the sliding plate 3 move to right as shown in FIG. 6.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket comprising:
a base;
a sliding plate mounted to the base and having a plurality of pin holes;
a plurality of contacts each comprising a base portion secured to the base and a pair of arms extending through the pin holes of the sliding plate; and
an actuator mounted on the base and including a frame and a plurality of actuating portion extending downwardly from the frame for driving the sliding plate to slide on the base in a first direction; wherein
the actuator includes a pushing portion contacting with the sliding plate and driving the sliding plate to move in a second direction opposite to said first direction, further comprising a spring located between the base and the sliding plate and urging the sliding plate move in the second direction, wherein the pushing portion and the actuating portion are extending downwardly from the frame, and both engage with a bearing section of the sliding plate, wherein the actuating portion and the pushing portion engage with two opposite side faces of the bearing section, respectively.

2. The burn-in socket as claimed in claim 1, wherein the actuator moves relative to the base in a vertical direction perpendicular to the first and second directions, and wherein the sliding plate engages with the actuating portion when the actuator moves downwardly and engages with the pushing portion when the actuator moves upwardly.

3. The burn-in socket as claimed in claim 1, wherein each contact comprises a stationary arm and a moving arm, and the sliding plate drives the moving arm relative to the stationary arm.

4. The burn-in socket as claimed in claim 1, further comprising a pair of locking elements, and the locking elements lock an IC package loaded on the sliding plate.

5. A burn-in socket comprising:
a base;
a sliding plate mounted to the base and sliding relative to the base in a horizontal direction, the sliding plate having a plurality of pin holes;
a plurality of contacts each comprising a base portion secured to the base and a pair of arms extending into the pin holes of the sliding plate; and
an actuator moving upwardly and downwardly relative to the base and including a frame, the actuator having a plurality of actuating portions and pushing portions extending downwardly from the frame and driving the sliding plate to move in opposite directions, respectively, further comprising a spring located between the base and the sliding plate, and wherein the spring and the pushing portions drive the sliding plate to move in a same direction, wherein each pushing portion and a corresponding actuating portion both engage with a same bearing section of the sliding plate.

6. The burn-in socket as claimed in claim 5, wherein said actuating portion and corresponding pushing portion are located at opposite sides of the bearing section.

7. The burn-in socket as claimed in claim 5, wherein the sliding plate engages with the actuating portion when the actuator moves downwardly and engages with the pushing portion when the actuator moves upwardly.

8. The burn-in socket as claimed in claim 5, wherein each contact comprises a stationary arm and a moving arm, and the sliding plate drives the moving arm relative to the stationary arm.

9. A burn-in socket comprising:
a base;
a sliding plate mounted to the base and sliding back and forth horizontally relative to the base;
a plurality of pin holes defined in the sliding plate;
a plurality of contacts each including a base portion disposed in the base and a moveable arm extending upwardly into the corresponding pin hole; and
an actuator moving up and down relative to the base, said actuator including an actuating portion urging the sliding plate toward a first horizontal direction, and a pushing portion urging the sliding plate toward a second horizontal direction opposite to said first horizontal direction; wherein
said actuating portion and the pushing portion essentially is offset from each other in a vertical direction so as to assure no interference between the sliding plate and the actuator during up-and-down movement of the actuator which drives the sliding plate to move back and forth in the first horizontal direction and the second horizontal direction, further including a spring constant urging the sliding plate toward the second horizontal direction so as to assure the sliding plate in a working condition once the actuator is released.

* * * * *